United States Patent [19]

Kojo

[11] Patent Number: 4,860,083
[45] Date of Patent: Aug. 22, 1989

[54] SEMICONDUCTOR INTEGRATED CIRCUIT
[75] Inventor: Takeshi Kojo, Kyoto, Japan
[73] Assignee: Matsushita Electronics Corporation, Kadoma, Japan
[21] Appl. No.: 73,851
[22] Filed: Jul. 14, 1987

Related U.S. Application Data

[63] Continuation of Ser. No. 4,791, Jan. 8, 1987, abandoned, which is a continuation of Ser. No. 666,609, Oct. 30, 1984, abandoned.

[30] Foreign Application Priority Data

Nov. 1, 1983 [JP] Japan ................................ 58-205174

[51] Int. Cl.⁴ .................... H01L 27/02; H01L 29/92; H01L 29/06
[52] U.S. Cl. ........................................ 357/51; 357/14; 357/20; 357/52
[58] Field of Search .................. 357/38, 23.13, 20, 52, 357/51, 14

[56] References Cited

U.S. PATENT DOCUMENTS

| | | | |
|---|---|---|---|
| 3,230,429 | 1/1966 | Stcheny | 357/51 |
| 3,354,360 | 11/1967 | Campagria et al. | 357/51 |
| 3,430,110 | 2/1969 | Goshgarian | 357/51 |
| 3,488,564 | 1/1970 | Crafts | 357/46 |
| 3,673,428 | 6/1972 | Athanas | 357/23.13 |
| 3,858,237 | 12/1974 | Sawazaki et al. | 357/51 |
| 3,889,358 | 6/1975 | Bierhenke | 357/51 |
| 4,057,894 | 11/1977 | Khajezadeh et al. | 357/51 |
| 4,080,619 | 3/1978 | Suzuki | 357/52 |
| 4,228,450 | 10/1980 | Anantha et al. | 357/51 |
| 4,255,674 | 3/1981 | Grenier et al. | 357/51 |
| 4,321,616 | 3/1982 | Bise | 357/52 |
| 4,438,449 | 3/1984 | Usuda | 357/23.13 |
| 4,463,370 | 7/1984 | Grenier | 357/51 |
| 4,480,319 | 10/1984 | Hotta et al. | 357/50 |

FOREIGN PATENT DOCUMENTS

| | | | |
|---|---|---|---|
| 52-75987 | 6/1977 | Japan | 357/23.13 |
| 56-158478 | 12/1981 | Japan | 357/23.13 |

Primary Examiner—Andrew J. James
Assistant Examiner—Ngan Van Ngo
Attorney, Agent, or Firm—Cushman, Darby & Cushman

[57] ABSTRACT

In a semiconductor IC, a diode and a resistor for surge protection are integratedly formed in a p-type common island region laterally isolated from a p-type epitaxial layer by oxide film, by forming an n-type region of high impurity concentration to reach down to an n-type buried region and a resistor region, respectively; the IC has higher integration and larger junction area of the diode, and achieve better surge protection.

1 Claim, 4 Drawing Sheets

SEMICONDUCTOR INTEGRATED CIRCUIT

This is a continuation of application Ser. No. 004,791 filed Jan. 8, 1987, which was abandoned upon the filing hereof, which in turn was a continuation of Ser. No. 666,609 filed Oct. 30, 1984, now abandoned.

BACKGROUND OF THE INVENTION

1. Field of the Invention

The present invention generally relates to an improvement of semiconductor integrated circuits wherein an epitaxial growth layer is separated by oxide film in the lateral direction, and more particularly relates to a semiconductor integrated circuit comprising a diode and a resistor for protecting the integrated circuit from surge, in the integrated circuit itself.

2. Description of the Prior Art

In semiconductor integrated circuits, it is liable that undesirable surge is introduced in the assembling process or testing process through the outside-connection terminals, to thereby deteriorate or shortcircuit some parts of the circuit. Accordingly, protection of the elements and circuits in the integrated circuit from damage by the surge is an important problem. As a measure of the protection, such construction techniques have been used as providing diodes and resistors for protection from the surges between bonding pads and circuit parts connected thereto on the semiconductor circuit wafer. The surge protection diode to be formed on the IC wafer for such purpose serves to lead the positive surge to the positive power source line and a negative surge to the ground. The surge protection resistors serve to increase time constants.

By a cooperative function of the above-mentioned diodes and resistors, the circuit elements in the semiconductor integrated circuit is protected from surges.

The diodes and resistors for protection from the surges are hitherto provided in separate island regions for respective diodes and respective resistors.

The technical configuration and problem of the conventional surge protection of the semiconductor integrated circuits is now described more in detail. As shown in FIG. 1, a resistor R of 100–1000 Ω is connected between a pin terminal "a" and a circuit terminal "b", to attenuate positive and negative surges to protect circuit elements in the semiconductor IC. A diode Di is connected between the pin terminal "a" and a power source terminal C (for $V_{cc}$) of such a polarity that its cathode is connected to the power source terminal C to lead a positive surge through the power source terminal C to a power source line.

FIG. 2 is a sectional view of an essential part of a conventional semiconductor IC comprising the resistance and the diode constituting the surge protection circuit, wherein the resistor and the diode are provided individually in respectively different island regions which are separated by oxide film.

That is, on a p-conductivity type silicon substrate 1, n-conductivity type buried regions 2 and 21 are formed and thereon a p-conductivity type silicon epitaxial layer is formed and silicon oxide isolation films 4, 4, 4 are produced by converting a part of the p-conductivity type silicon epitaxial layer, to thereby make island regions 3 and 31 on the buried regions 2 and 21, respectively. On the other hand, an n-conductivity type diffused region 5 of high impurity concentration having a diffusion depth sufficient to reach to the buried region 2 is formed as a cathode region. A shallow p-conductivity type contact region 6 is produced by diffusion to serve as a part of an anode region of the diode. Further, in another island region 31, a shallow p-conductivity type diffused region 7 is formed to serve as a resistor region. Finally openings are bored at the part to form contact electrodes of the diode and the resistors, and therein an electrode 8 for connecting the anode of the diode and one terminal of the resistor. A electrode 82 contacts the other end of the resistor, and another electrode 81 to contact the cathode side of the diode. Thus, the diode part is made in the left island 3 and the resistor is made in the right island 31. In the above-mentioned configuration, since the diode and the resistor were made in different island regions 3 and 31, parts of the diode and resistor became unnecessarily large, thereby hindering high integration; and on the other hand, in the diode part the area of the p-n junction was not so large for the area of the island 3, and therefore the surge protection effect is not satisfactory.

SUMMARY OF THE INVENTION

The present invention accordingly purposes to provide an improved semiconductor integrated circuit wherein by producing a diode and a resistor for surge protection in a common island region, the area on the IC wafer for the surge protection elements is effectively decreased and at the same time provides a sufficiently large area for the pn junction of the diode part of the surge protection element; thereby attaining higher integration of IC and effective surge protection.

The semiconductor integrated circuit comprises: a. a semiconductor substrate of a first conductivity type having a buried region of a second conductivity type which is opposite to the first conductivity type, b. a semiconductor island region of the first conductivity type disposed on the buried region and surrounded by insulation film, c. a resistance region of the first conductivity type formed in the semiconductor island region, d. a high impurity concentration region of the second conductivity type selectively formed in the semiconductor island region in a manner to reach the buried region, and e. electrodes formed on both ends of the resistor region and on surface parts of the high impurity concentration region.

According to the above-mentioned configuration, higher integration of a IC is achievable by providing the diode and the resistor for surge protection in a common island region in the IC, and further better performance of surge protection is achievable by providing a larger area of the diode junction.

DESCRIPTION OF THE PREFERRED EMBODIMENTS

Figure 1:
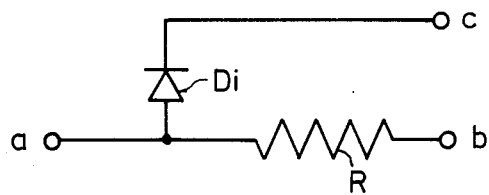
FIG. 1 is the circuit diagram of surge protection part of the conventional IC.
Figure 2:
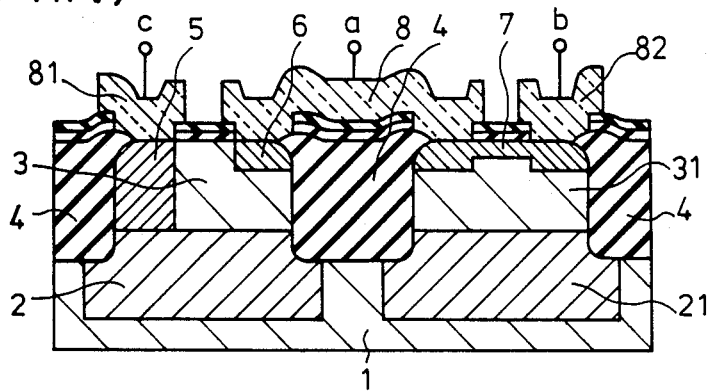
FIG. 2 is the sectional elevation view of the example of surge protection portion of the conventional IC.
Figure 3:
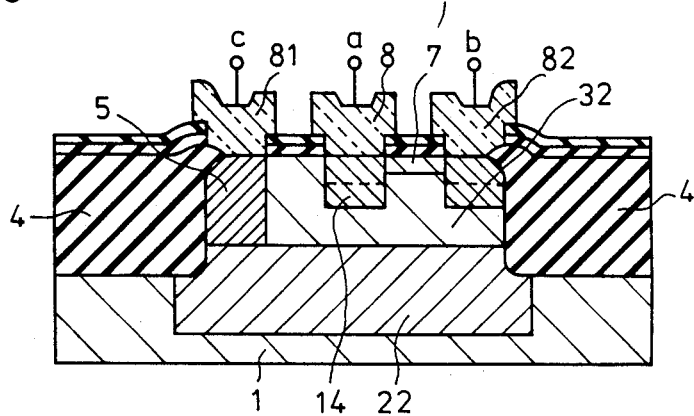
FIG. 3 is a sectional elevation view of an embodiment of the surge protection circuit part of an IC embodying the present invention.

FIG. 3 shows sectional elevation view of a diode and a resistor for surge protection, both integrated in a common island region. In FIG. 3, in a p-conductivity type silicon substrate 1, an n-conductivity type buried region 22 is formed, and thereon a p-conductivity type region is formed by, for instance, an epitaxial growth process. The p-conductivity type region is surrounded by silicon oxide films 4 formed by oxidizing necessary parts of the p-conductivity type region to form an island region 32 of p-conductivity type. Then, in this island region 32, an n-conductivity type region 5 of high impurity concentration becomes the cathode of a diode and a p-conductivity type diffused region 14 to serve as the anode contact region of the diode is also formed. Another p-type region 7 is formed to serve as resistor region; an electrode 8 for anode contact of the diode and one terminal of the resistor 7, an electrode 81 for cathode contact of the diode and an electrode 82 for the other end of the resistor are provided.

Figure 4:
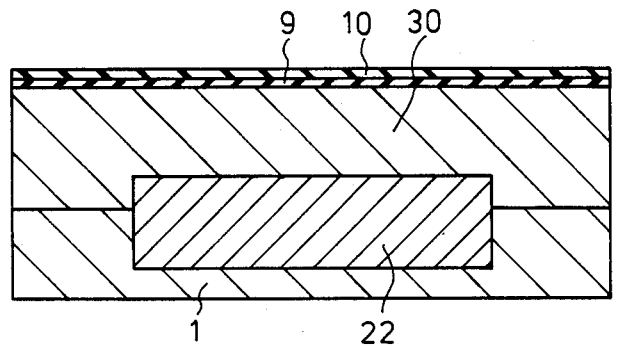
FIG. 4, FIG. 5, FIG. 6, FIG. 7, FIG. 8 and FIG. 9 are sectional elevation views showing the flow of manufacturing of one embodiment in accordance with the present invention.

Next a concrete manufacturing process for producing the above-mentioned configuration of the semiconductor IC is described below in detail. Firstly, in a p-conductivity type silicon substrate 1, antimony (Sb) or arsenic (As) are selectively doped by the spin-on-method or the ion implantation method or the capsule method by utilizing a silicon oxide film as a mask, thereby the buried region 22 of n-conductivity type is formed. Then, the silicon oxide film on the surface of the wafer is removed from all of the principal surface, and a p-conductivity type silicon layer 30 of a specific resistance of 0.5–10 Ωcm is epitaxially grown on all the principal surface to a thickness of 0.5–2 μm. Thereafter, on all the surface of the p-conductivity type silicon layer 30, a silicon oxide film 9 having a thickness of 100–500 Å, and thereon, a silicon nitride film 10 having a thickness of 500–1500 Å are sequentially formed as shown in FIG. 4.

Figure 5:
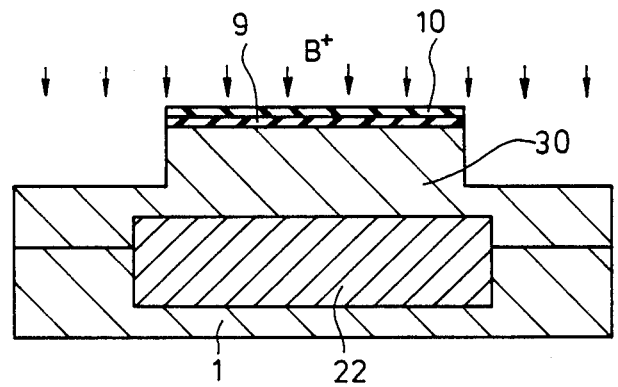

Next, these films 9 and 10 are etched by known a photolithographic etching method, in a manner that the silicon oxide film 9 and silicon nitride film 10 are retained only on the part of the p-conductivity type silicon region 30 that is above the n-conductivity type buried region 22 and which is to become an island region 32 wherein the surge protecting elements are formed. Then p-conductivity type silicon layer 30 which is exposed by the removing of the films 9 and 10 are etched so that its thickness becomes about half. Then, boron (B) is ion-implanted as an acceptor impurity as shown in FIG. 5. This implantation of boron is carried out to prevent forming of undesirable channel under silicon oxide films for isolating the island region 32 and adajcent island regions.

Figure 6:
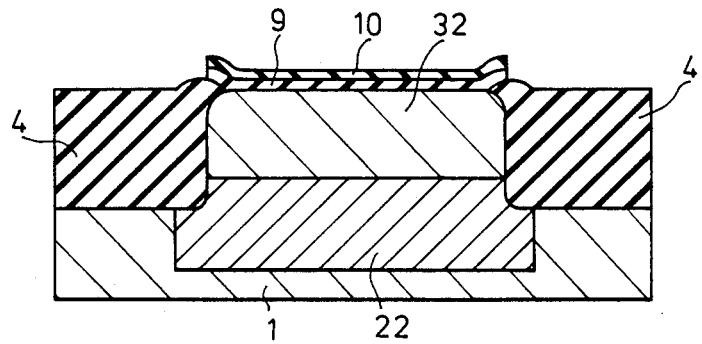

Thereafter, in a high pressure oxidation furnace or the like, oxidation is carried out. In this oxidation, parts of the p-conductivity silicon layer 30 which are not covered by the silicon nitride film 10 is selectively oxidized to form silicon oxide film 4 to isolate the island region 32 of p-conductivity type as shown in FIG. 6.

Figure 7:
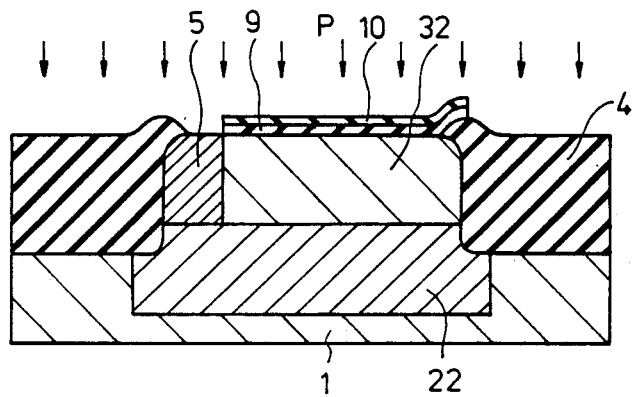
Figure 8:
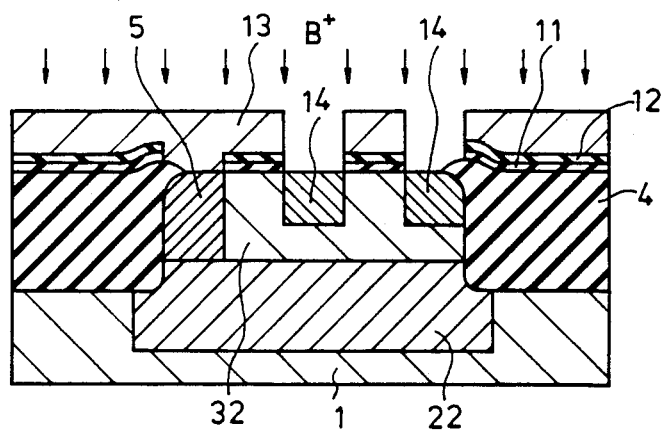

Thereafter, silicon oxide film 9 and silicon nitride film 10 covering the wafer at the portion to become the cathode region of the diode is removed by a known photolithographic etching method, and subsequently phosphorine (P) as a donor impurity is diffused by an ion-implantation method or thermal diffusion method, to form a high concentration n-conductivity diffused region 5 in a manner that its diffused front reaches to a depth sufficient to come into the n-conductivity type buried region 22 as shown in FIG. 7. Then, the silicon nitride film 10 and silicon oxide film 9 are all removed by the known method, and on the exposed surface of the wafer, an oxide silicon film 11 having a thickness of 100–500 Å and a silicon nitride film 12 having a thickness of 500–1500 Å are sequentially formed. Thereafter the silicon oxide film 11 and the silicon nitride film 12 which are above the portion forming electrode contacts for the diode and the resistor are selectively etched away. Thereafter, by covering other parts than the above-mentioned electrode contact forming parts, said other parts being only the resistor contact forming parts, with photoresist film 13, boron (B) as an impurity is ion-implanted to such a large quantity that surface impurity concentration of the resultant p-conductivity type diffused region 14 becomes suitable for ohmic contact, as shown in FIG. 8.

Figure 9:
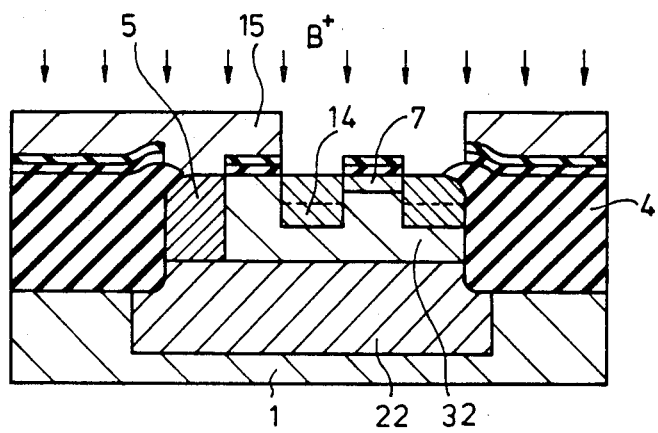

Nextly, after removing all the photoresist film 13, another photoresist film 15 is formed, and it is selectively removed at the part above the region to become the resistor region, and boron (B) is ion-implanted to form the resistor region 7 as shown in FIG. 9.

Then, the photoresist film 15 is removed, and the portions forming electrodes for the cathode of the diode and the resistor are exposed, and electrodes are formed by high impurity aluminum or by aluminum utilizing about 1% silicon in weight. Thus, one electrode 8 is formed to contact one end of the resistor region 7 and also the anode contact region 14 of the diode. Two other electrodes 81 and 82 which contact the cathode contact region 5 of the diode and the other end of the resistor 7, respectively, are provided;. Thus, the resistor and the diode, both for protecting surge for the integrated circuit, are made in a common island region 32 as shown in FIG. 3 which is a sectional elevation view of a part of a completed IC. Besides, the area of the junction which forms the diode becomes sufficiently large, because it is defined by the junction faces between the high concentration n-conductivity diffused region 5 and the p-conductivity type island region 32 and between the diffused region 5 and the buried region 22, and thereby satisfactory surge protection is achievable.

In the above-mentioned manufacturing process of the semiconductor IC, since the p-conductivity type resistor region 7 is formed in the island region 32 which is isolated in the island shape in the p-conductivity type silicon epitaxial layer 30, the electrode of the resistor becomes the same voltage as that of the p-conductivity type island region 32, and the electrode of the resistor can serve as the anode electrode of the diode.

Figure 10:
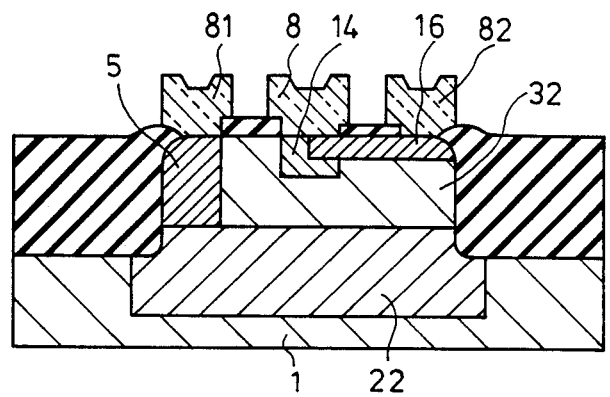
FIG. 10 is a sectional elevation view of one embodiment of an n-conductivity type resistor as the surge protection portion in accordance with the present invention.

Apart from the above-mentioned species, a modified embodiment can be manufactured as shown in FIG. 10, wherein departing from the step of FIG. 7, and then by carrying out ion-implanting, an n-type impurity after the forming of the p-conductivity region 14, an n-conductivity type resistor region 16 is formed at the same time with forming emitter regions of transistors in the IC (not shown here), to use this n-type region 16 as the resistor. In this case, since the p-conductivity type island region 32 is at the same potential as that of the resistor region 16 and the p-conductivity type island region 32 is used as the anode of the diode, an electrode 8, which is connected to both one end of the resistor region 16 and the anode region of the diode insert should be formed to extend both on the p-conductivity type diffused region 14 and the above-mentioned one end of the resistor region 16.

Figure 11:
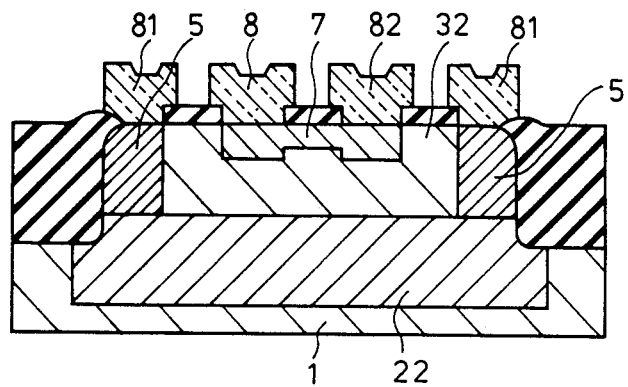
FIG. 11 is a sectional elevation view of a surge protection diode having reduced resistors embodying the present invention.

In the above-mentioned configurations, the high impurity n-conductivity type diffused region 5, which is to become the cathode of the diode and extends down to the buried region 22, is provided only on one side of the island region 32. But, the n-conductivity type diffused region 5 of high impurity concentration may be made around the island region 32 to surround it as shown in FIG. 11. This achieves a large junction area as the diode, and lowers the internal resistance of the diode, to thereby improve the surge protection effect of the diode. Such species can be made departing from the step of FIG. 6, by forming the encircling diffused region 5, prior to the ion-implantation of the p-conductivity type region 7.

Figure 12:
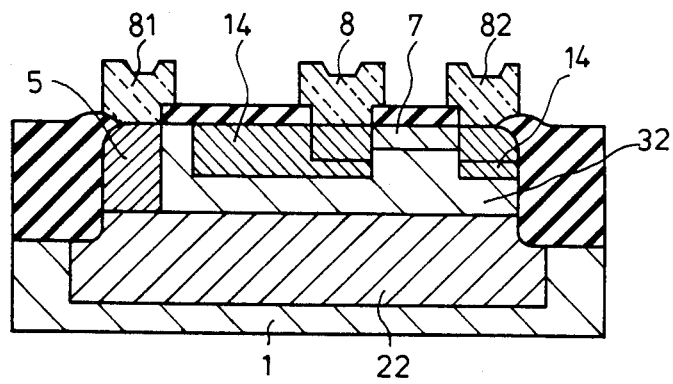
FIG. 12 is a sectional elevation view of still another surge protection diode part with reduced resistance embodying the present invention.

Furthermore, another modification for lowering the internal resistance of the diode can be made as shown in FIG. 12, wherein a p-conductivity type diffused region 14, which is an extention of the region to form the anode contact region of the diode is extended close to the neighborhood of the n-conductivity type diffused region 5 of high impurity concentration.

Apart from the above-mentioned descriptions wherein the surge protection diode is used as positive surge protection, hence connected to the power source line (Vcc) by the cathode, a modified configuration may be made such as the cathode region of the diode is formed by n-conductivity type buried region 22 and high impurity concentration n-conductivity type diffused region 5, and the cathode region is connected to one end of the resistor, and on the other hand, the p-conductivity type silicon substrate 1 is used as the anode region. When taking such configuration, the diode can protect negative surge.

What is claimed is:

1. A semiconductor integrated circuit comprising:
   a. a semiconductor substrate of a first conductivity type having, at a portion thereof, a buried region of a second conductivity type which is opposite to said first conductivity type,
   b. a single semiconductor island region of low impurity concentration and of said first conductivity type disposed on said buried region and surrounded by an insulation film,
   c. a resistance region of said second conductivity type formed in said semiconductor island region in electrical contact therewith,
   d. a diode contact region of said first conductivity type and of a high impurity concentration connected to one end of said resistance region and formed in said semiconductor island region,
   e. a high impurity concentration region of said second conductivity type selectively formed in said semiconductor island region in a manner to reach said buried region, and
   f. a plurality of electrodes, one formed on a part extending over said resistance region and said diode contact region of said diode, another formed on another end of said resistance region and a third formed on a surface of said high impurity concentration region.

* * * * *